United States Patent
Huang et al.

(10) Patent No.: US 7,821,755 B2
(45) Date of Patent: Oct. 26, 2010

(54) RESETTABLE SHORT-CIRCUIT PROTECTION CONFIGURATION

(75) Inventors: Yung-Chih Huang, Changhua County (TW); Ta-Te Hsieh, Taichung County (TW); Chieh-Jung Li, Kaohsiung (TW)

(73) Assignee: Universal Scientific Industrial (Shanghai) Co., Ltd., Shanghai (CN)

( * ) Notice: Subject to any disclaimer, the term of this patent is extended or adjusted under 35 U.S.C. 154(b) by 410 days.

(21) Appl. No.: 12/073,826

(22) Filed: Mar. 11, 2008

(65) Prior Publication Data

US 2009/0230477 A1    Sep. 17, 2009

(51) Int. Cl.
H02H 3/06    (2006.01)

(52) U.S. Cl. .................. 361/93.4; 361/71; 361/74

(58) Field of Classification Search .......... 361/71, 361/74, 93.1, 93.4
See application file for complete search history.

(56) References Cited

U.S. PATENT DOCUMENTS 5,724,218 A    3/1998 Tihanyi
7,362,080 B2 *  4/2008 Sohn et al. ............. 323/277
2008/0186644 A1 *  8/2008 Migliavacca ........... 361/86
2009/0009919 A1 *  1/2009 Taylor .................. 361/75

* cited by examiner

Primary Examiner—Jared J Fureman
Assistant Examiner—Christopher J Clark
(74) Attorney, Agent, or Firm—Bacon & Thomas, PLLC

(57) ABSTRACT

A resettable short circuit protection configuration includes a power input terminal, a power output terminal, a first electrically controlled switch, which has a control end and two conducting ends, the two conducting ends being respectively electrically connected to the power input terminal and the power output terminal, a second electrically controlled switch, which has a control end and two conducting ends, the two conducting ends being respectively electrically connected to the power input terminal and the control end of the first electrically controlled switch, a first resistor, which has two opposite ends respectively electrically connected to the control end of the first electrically controlled switch and a grounding terminal, and a second resistor, which has two opposite ends respectively electrically connected to the control end of the second electrically controlled switch and the power output terminal.

4 Claims, 1 Drawing Sheet

RESETTABLE SHORT-CIRCUIT PROTECTION CONFIGURATION

BACKGROUND OF THE INVENTION

1. Field of the Invention

The present invention relates to electronic circuits and more particularly, to a resettable short-circuit protection configuration.

2. Description of the Related Art

For the protection of a circuit system to prevent short circuit, a fuse is usually installed in the power end. However, a fuse is not reusable. When a fuse is burned out, it must be replaced with a new one. Therefore, it is desirable to provide a short circuit protection architecture that can be reset to supply power again after the short circuit has been eliminated.

U.S. Pat. No. 5,724,218 discloses a circuit configuration for short-circuit protection of a power transistor, which comprises a depletion MOSFET, an enhancement MOSFET, a resistor, a variable thermal resistor, and a current sensor. This circuit architecture provides short-circuit protection. However, because the circuit configuration uses a current sensor for short circuit detection, many circuit components are used. In consequence, the manufacturing cost of the circuit configuration is high.

SUMMARY OF THE INVENTION

The present invention has been accomplished under the circumstances in view. It is the main object of the present invention to provide a resettable short circuit protection configuration, which automatically cuts off power supply upon a short circuit, and returns to normal after the short circuit trouble has been eliminated.

It is another object of the present invention to provide a resettable short circuit protection configuration, which has a simple circuit structure that is inexpensive to manufacture.

To achieve these and other objects of the present invention, the resettable short circuit protection configuration comprises a power input terminal, a power output terminal, a first electrically controlled switch, a second electrically controlled switch, a first resistor, and a second resistor. The first electrically controlled switch comprises a control end, and two conducting ends that are respectively electrically connected to the power input terminal and the power output terminal. The second electrically controlled switch comprises a control end, and two conducting ends that are respectively electrically connected to the power input terminal and the control end of the first electrically controlled switch. The first resistor has the two opposite ends respectively electrically connected to the control end of the first electrically controlled switch and a grounding terminal. The second resistor has the two opposite ends respectively electrically connected to the control end of the second electrically controlled switch and the power output terminal. By means of the aforesaid arrangement, the resettable short circuit protection configuration immediately cuts off power supply from the output terminal upon a short circuit at the external device that is connected to the power output terminal. After the short circuit trouble has been eliminated from the external device, the resettable short circuit protection configuration resumes to the normal working status.

DETAILED DESCRIPTION OF THE INVENTION

Figure 1:
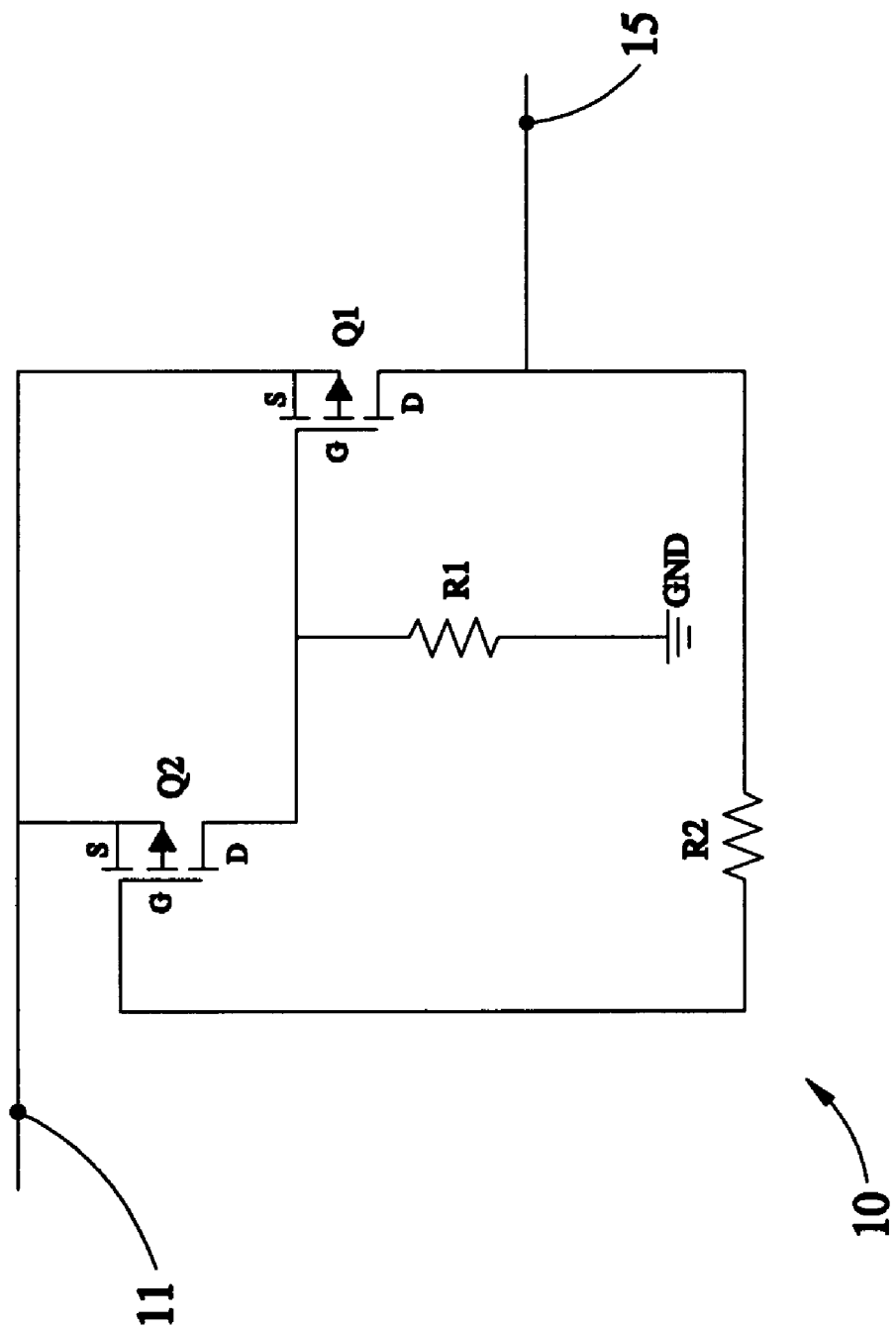
FIG. 1 is a circuit diagram of a resettable short circuit protection configuration in accordance with the carrier substrate before installation.

Referring to FIG. 1, a resettable short circuit protection configuration 10 in accordance with the present invention is shown comprising a power input terminal 11, a power output terminal 15, a first electrically controlled switch Q1, a second electrically controlled switch Q2, a first resistor R1, and a second resistor R2.

The first electrically controlled switch Q1 is a semiconductor switch, for example, a PMOS (P-pass metal-oxide-semiconductor field-effect transistor), having a control end (the gate) G, and two conducting ends (the source and the drain) S and D. The conducting ends S and D are respectively connected to the power input terminal 11 and the power output terminal 15.

The second electrically controlled switch Q2 is a semiconductor switch, for example, a PMOS (P-pass metal-oxide-semiconductor field-effect transistor), having a control end (the gate) G, and two conducting ends (the source and the drain) S and D. The conducting ends S and D are respectively connected to the power input terminal 11 and the control end G of the first electrically controlled switch Q1.

The first resistor R1 has its two opposite ends respectively electrically connected to the control end G of the first electrically controlled switch Q1 and a grounding terminal GND.

The second resistor R2 has its two opposite ends respectively electrically connected to the control end G of the second electrically controlled switch Q2 and the power output terminal 15. Further, the resistance value of the second resistor R2 is greater than the first resistor R1.

The resettable short circuit protection configuration 10 works subject to the following description.

The power input terminal 11 is electrically connected to an external power source (not shown), and the power output terminal 15 is electrically connected to an external device (not shown).

During normal working of the external device, the external power source provides electricity to the power input terminal 11. Because the resistance value of the second resistor R2 is greater than the first resistor R1, the charging time constant R2Cg is greater than R1Cg (Cg is the gate capacitance). Therefore, at the first electrically controlled switch Q1, Vsg>Vth, and the first electrically controlled switch Q1 is electrically conducted prior to the second electrically controlled switch Q2. At this time, electricity goes from the external power source through the power input terminal 11 and the first electrically controlled switch Q1 to the external device via the power output terminal 15. At this time, at the second electrically controlled switch Q2, Vsg<Vth, i.e., the second electrically controlled switch Q2 is off.

When the external device is short circuited, the voltage at the power output terminal 15 is zeroed, and Vsg>Vth at the second electrically controlled switch Q2, and therefore the second electrically controlled switch Q2 is electrically conducted. At the same time, the voltage at the control end G of the first electrically controlled switch Q1 is equal to the voltage of the external power source, therefore Vsg<Vth at the first electrically controlled switch Q1, and the first electrically controlled switch Q1 is off, i.e., the power output terminal 15 provides no power output, achieving the desired short circuit protection effect.

After the short circuit trouble has been eliminated from the external device, the external power source is reset to conduct the first electrically controlled switch Q1, resuming to the normal supply status.

As stated above, the invention provides a resettable short circuit protection configuration, which has the following features and advantages:

1. Short circuit protection and resettable function: Upon a short circuit of the external device, the resettable short circuit protection configuration immediately cuts off power supply to provide a short circuit protection effect; after the short circuit trouble has been eliminated, the resettable short circuit protection configuration is resumed to the normal working status.
2. Simple circuit structure and low cost: The resettable short circuit protection configuration uses two electrically controlled switches and two resistors to achieve the desired resettable short circuit protection. When compared to prior art designs, the structure of the present invention is simple and cheap.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A resettable short circuit protection configuration comprising:
   a power input terminal;
   a power output terminal;
   a first electrically controlled switch, said first electrically controlled switch comprising a control end and two conducting ends, the two conducting ends of said first electrically controlled switch being respectively electrically connected to said power input terminal and said power output terminal;
   a second electrically controlled switch, said second electrically controlled switch comprising a control end and two conducting ends, the two conducting ends of said second electrically controlled switch being respectively electrically connected to said power input terminal and the control end of said first electrically controlled switch;
   a first resistor, said first resistor having two opposite ends thereof respectively electrically connected to the control end of said first electrically controlled switch and a grounding terminal; and
   a second resistor, said second resistor having two opposite ends thereof respectively electrically connected to the control end of said second electrically controlled switch and said power output terminal.

2. The resettable short circuit protection configuration as claimed in claim 1, wherein said second resistor has a resistance greater than said first resistor.

3. The resettable short circuit protection configuration as claimed in claim 1, wherein said first electrically controlled switch and said second electrically controlled switch are semiconductor switches.

4. The resettable short circuit protection configuration as claimed in claim 3, wherein said semiconductor switches are P-pass metal-oxide-semiconductor field-effect transistors, and said first electrically controlled switch and said second electrically controlled switch have the respective source respectively electrically connected to said power input terminal.

* * * * *